United States Patent
Yang et al.

(10) Patent No.: US 7,816,972 B2
(45) Date of Patent: Oct. 19, 2010

(54) MULTIPLEXER CIRCUIT

(75) Inventors: Kyoung Hoon Yang, Daejon (KR); Tae Ho Kim, Hwaseong-si (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 510 days.

(21) Appl. No.: 11/943,074

(22) Filed: Nov. 20, 2007

(65) Prior Publication Data

US 2009/0080465 A1   Mar. 26, 2009

(30) Foreign Application Priority Data

Aug. 30, 2007   (KR) .................. 10-2007-0087546

(51) Int. Cl.
*H03K 17/62* (2006.01)
(52) U.S. Cl. ...................... 327/407; 327/408
(58) Field of Classification Search .......... 327/407–413
See application file for complete search history.

(56) References Cited

U.S. PATENT DOCUMENTS

| | | | | |
|---|---|---|---|---|
| 6,310,509 B1 * | 10/2001 | Davenport et al. | .......... | 327/407 |
| 6,614,291 B1 * | 9/2003 | Zhao et al. | .................. | 327/408 |
| 7,123,074 B2 * | 10/2006 | Neumann | .................... | 327/407 |
| 7,319,356 B1 * | 1/2008 | Karim | ........................ | 327/407 |

* cited by examiner

*Primary Examiner*—Hai L Nguyen
(74) *Attorney, Agent, or Firm*—Adam K. Sacharoff; Much Shelist (57) ABSTRACT

Disclosed herein is a multiplexer circuit. The multiplexer circuit includes a first differential output unit, a second differential output unit, and a selection unit. The first differential output unit receives NRZ input signals ($D_1$ and $\overline{D_1}$) and a clock signal (CLK), and generates differential RZ-mode outputs ($R_1$ and $\overline{R_1}$). The second differential output unit receives NRZ input signals ($D_2$ and $\overline{D_2}$) and an inverted clock signal ($\overline{CLK}$), and generates differential RZ-mode outputs ($R_2$ and $\overline{R_2}$). The selection unit receives the RZ-mode output signals ($R_1$, $\overline{R_1}$, $R_2$, and $\overline{R_2}$) generated at the first differential output unit and the second differential output unit, and generates NRZ mode outputs in each half cycle of the clock signal (CLK).

9 Claims, 12 Drawing Sheets

MULTIPLEXER CIRCUIT

BACKGROUND OF THE INVENTION

1. Field of the Invention

The present invention relates generally to a multiplexer circuit, and, more particularly, to a multiplexer circuit that enables a reduction in the number of devices using negative differential resistance devices, and that enables low power operation using RZ-mode signals.

2. Description of the Related Art

Currently, with the increase in the demand for broadband communication service and very high-speed Internet, very high-speed communication networks, which can transfer a large amount of information, such as images as well as voice signals, in a short time, have become required. In order to implement such very high-speed broadband systems, the development of very high-speed digital circuits is essential.

Up to now, in very high-speed digital circuits, very high-speed digital logic gates have been implemented using Heterojunction Bipolar Transistors (HBTs) or High Electron Mobility Transistors (HEMTs), which are Gallium Arsenide (GaAs) or Indium Phosphide (InP)-based very high-speed devices, in an Emitter Coupled Logic (ECL), Current Mode Logic (CML), or Source Coupled FET Logic (SCFL) circuit configuration.

Patents have been applied for or granted with respect to various conventional technologies related to multiplexers used in very high-speed digital circuits, including Korean Unexamined Patent Publication No. 10-2004-0031532, entitled "Glitch-free Asynchronous Digital Multiplexer having Power Saving Mode".

The asynchronous digital multiplexer includes an edge detection circuit for receiving a data selection signal, detecting edges, and generating a first control signal, a selection synchronization circuit for receiving the data selection signal, a first clock input signal, and a second clock input signal, and selecting one from among the first clock input signal and the second clock input signal under the control of a second control signal, a clock signal synchronization circuit for receiving the first control signal and an output signal of the selection synchronization circuit, synchronizing the data selection signal with the selected clock input signal, and generating a second control signal, and a saving mode selection unit for receiving the second control signal, the output signal of the selection synchronization circuit and a power-down signal, and generating an output clock signal.

However, since the above-described technology uses a feedback loop, there are problems in that the construction of the circuit is complicated, so that the operating speed of the circuit is limited and power consumption increases.

Figure 1:
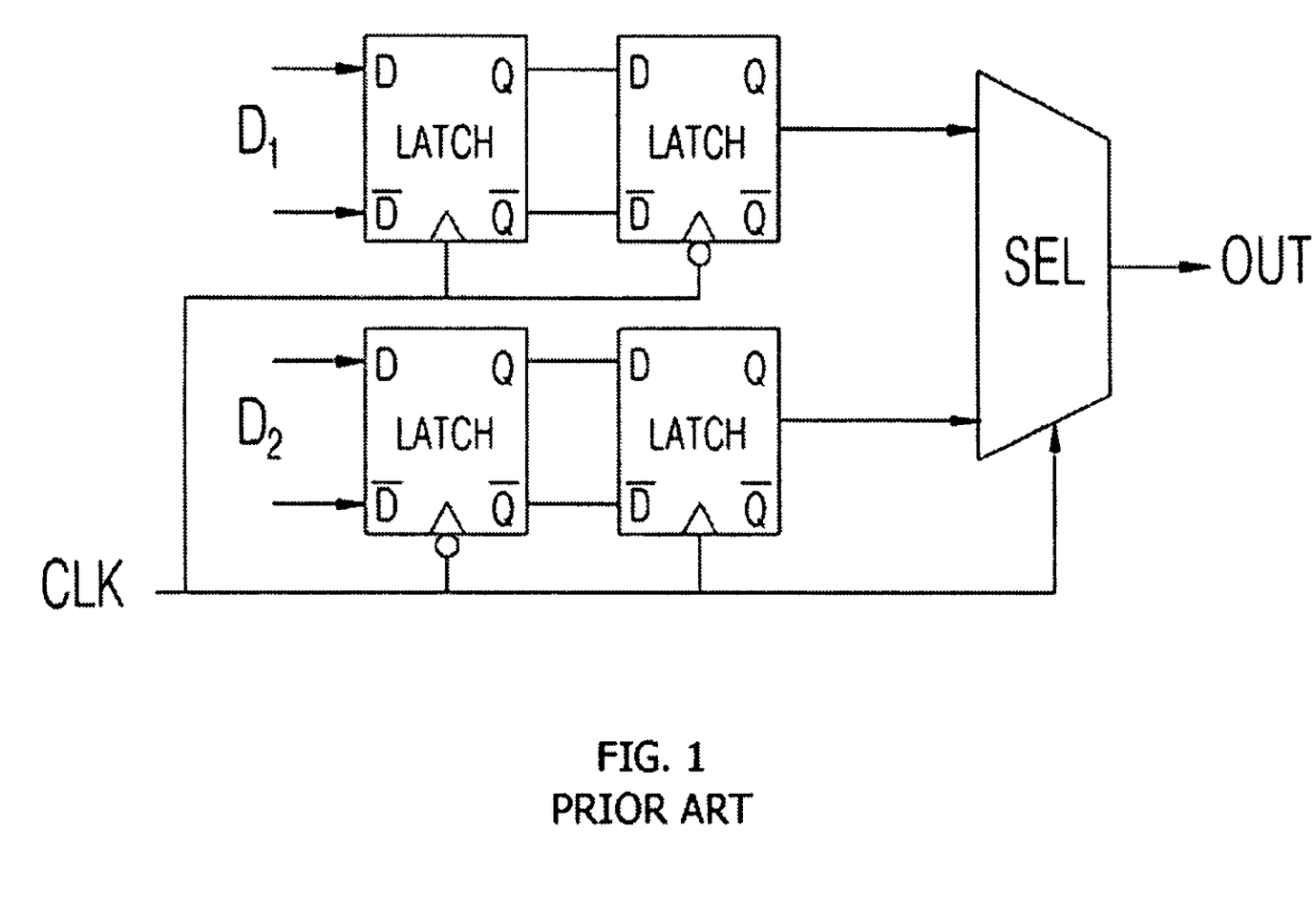
FIG. 1 is a circuit diagram showing a conventional master-slave type 2:1 multiplexer circuit.

That is, conventionally, when a multiplexer circuit is implemented, the multiplexer circuit is configured using four latch circuits for latching low frequency band signals, and a selection unit for multiplexing two low frequency band signals, as shown in FIG. 1.

Figure 2:
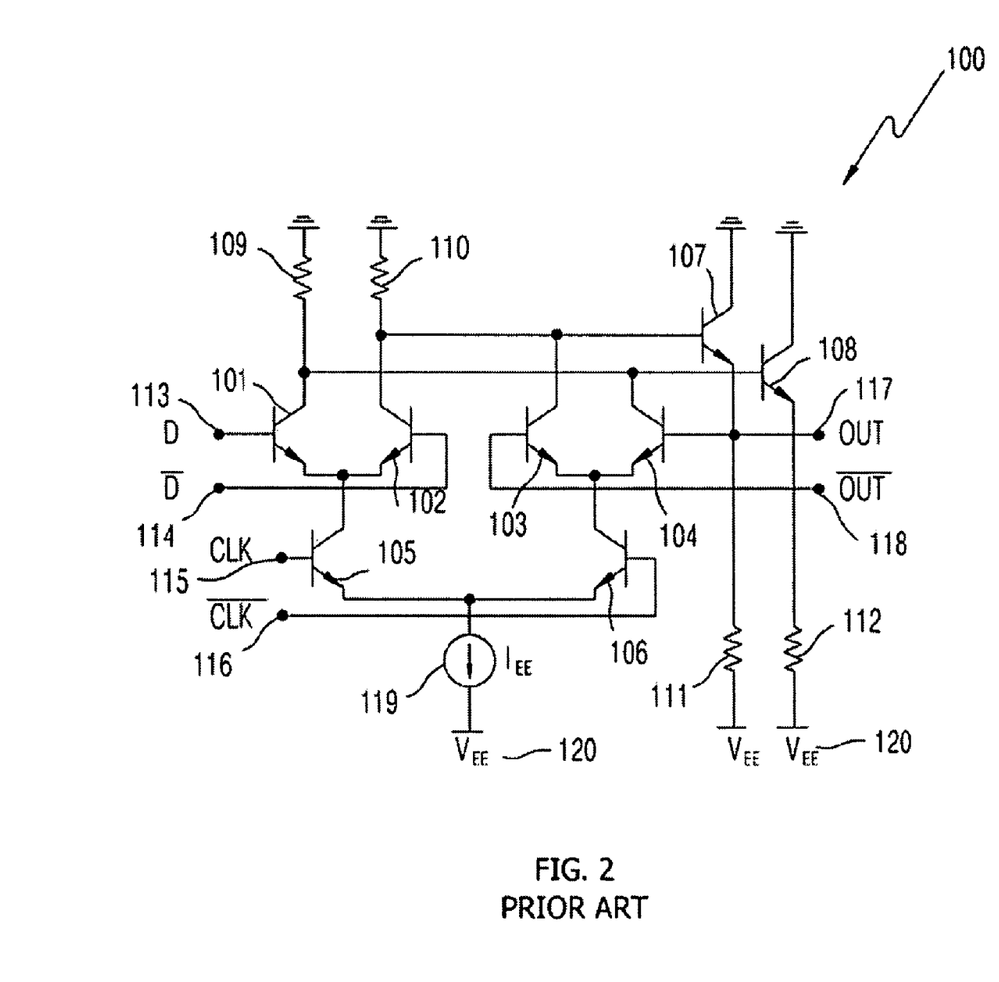
FIG. 2 is a circuit diagram showing the latch circuit of the conventional master-slave type 2:1 multiplexer circuit.

As shown in FIG. 2, the latch circuits are configured using master-slave latch circuits. Since the latch circuit is configured using data input transistors 101 and 102, clock (CLK) input transistors 105 and 106, a current source 119, and load resistors 109 and 110, the voltage source 120 of the latch circuit should maintain a value ranging from −3.5 V to −5.5 V. Therefore, there is a problem in that the power consumption of the latch circuit increases. Further, the impedance at the output terminal increases due to the feedback transistors 103 and 104 used to latch signals, and thus there is a limitation in operating speed.

Figure 3:
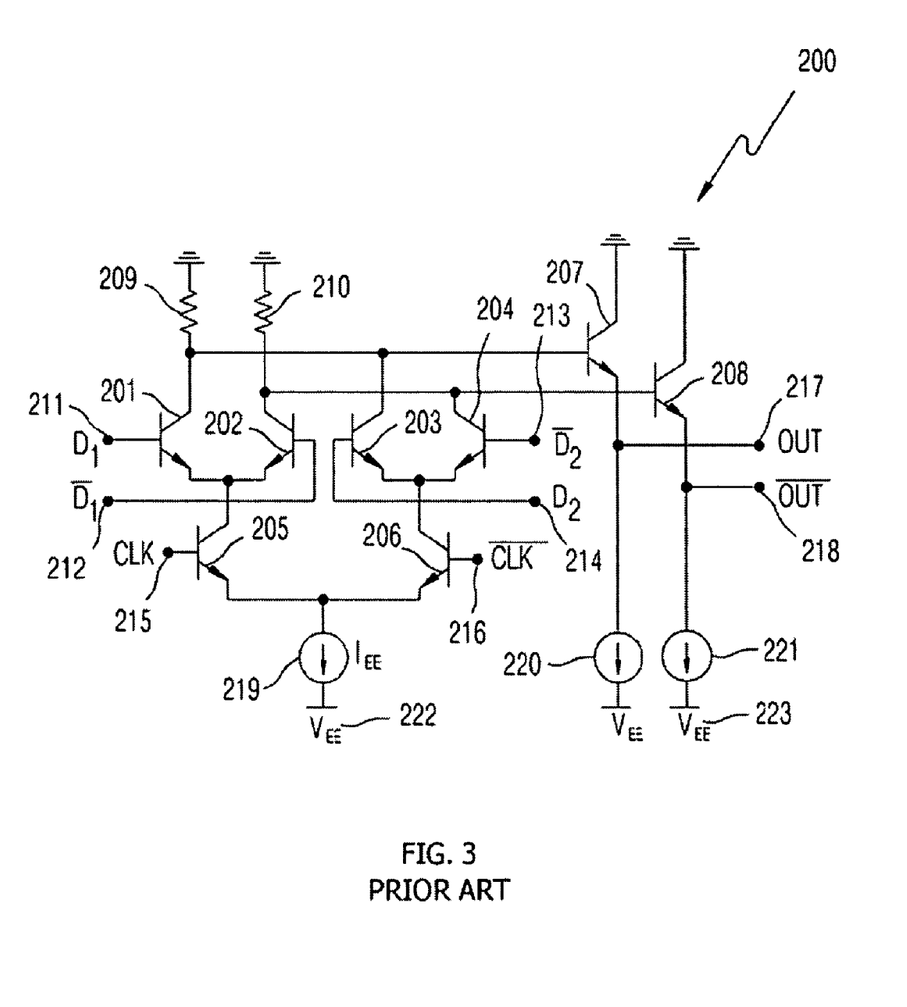
FIG. 3 is a circuit diagram showing a selection circuit, which is used in the conventional master-slave type 2:1 multiplexer circuit and operates in NRZ-mode.

Further, FIG. 3 shows a selection unit that operates in a master-slave multiplexer in Non-Return-to-Zero (NRZ) mode. Here, when the latch circuit shown in FIG. 1 receives two low frequency signals $D_1$ and $D_2$ and a clock signal CLK is at a high level, a CLK transistor 205 is turned on and transmits the data input $D_2$ to an output terminal. In contrast, when the clock signal CLK is at a low level, a CLK transistor 206 is turned on and transmits the data input $D_2$ to the output terminal. However, since the selection unit, shown in FIG. 3, which operates in NRZ-mode, is configured such that load resistor terminals 209 and 210, data input transistor terminals 201, 202, 203, and 204, CLK input terminals 205 and 206, and a current source terminal 219 are connected in series to one another, there is a problem in that power consumption is high.

SUMMARY OF THE INVENTION

Accordingly, the present invention has been made keeping in mind the above problems occurring in the prior art, and an object of the present invention is to provide a multiplexer circuit that has a simple circuit configuration using negative differential resistance diodes.

Another object of the invention is to provide a multiplexer circuit that enables low-power operating characteristics, which reduce the power consumption of the circuit by generating an NRZ-mode multiplexed output using an RZ-mode input.

Still another object of the invention is to provide a multiplexer circuit that improves operating speed using CML-type transistors.

In order to accomplish the above objects, the present invention provides a multiplexer circuit, including a first differential output unit for receiving NRZ input signals ($D_1$ and $\overline{D_1}$) and a clock signal (CLK), and generating differential RZ-mode outputs ($R_1$ and $\overline{R_1}$); a second differential output unit for receiving NRZ input signals ($D_2$ and $\overline{D_2}$) and an inverted clock signal ($\overline{CLK}$), and generating differential RZ-mode outputs ($R_2$ and $\overline{R_2}$); and a selection unit for receiving the RZ-mode output signals ($R_1$, $\overline{R_1}$, $R_2$, and $\overline{R_2}$) generated at the first differential output unit and the second differential output unit, and generating NRZ mode outputs in each half cycle of the clock signal (CLK).

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The features and advantages of the present invention will be apparent from the following description, which is made in conjunction with the accompanying drawings. The terms and words used in the present specification and claims should be interpreted as having meanings and concepts that conform to the technical spirit of the present invention based on the principal in which an inventor can appropriately define the concepts of terms in order to describe the inventor's own invention in the most appropriate way. It should be noted that, in the following description, when it is determined that the detailed descriptions of well-known functions related to the present invention and the construction thereof would make the gist of the present invention obscure, they are omitted.

The present invention will be described in detail with reference to the accompanying drawings below.

A multiplexer circuit according to an embodiment of the present invention is described with reference to FIGS. 4 to 12 below.

Figure 4:
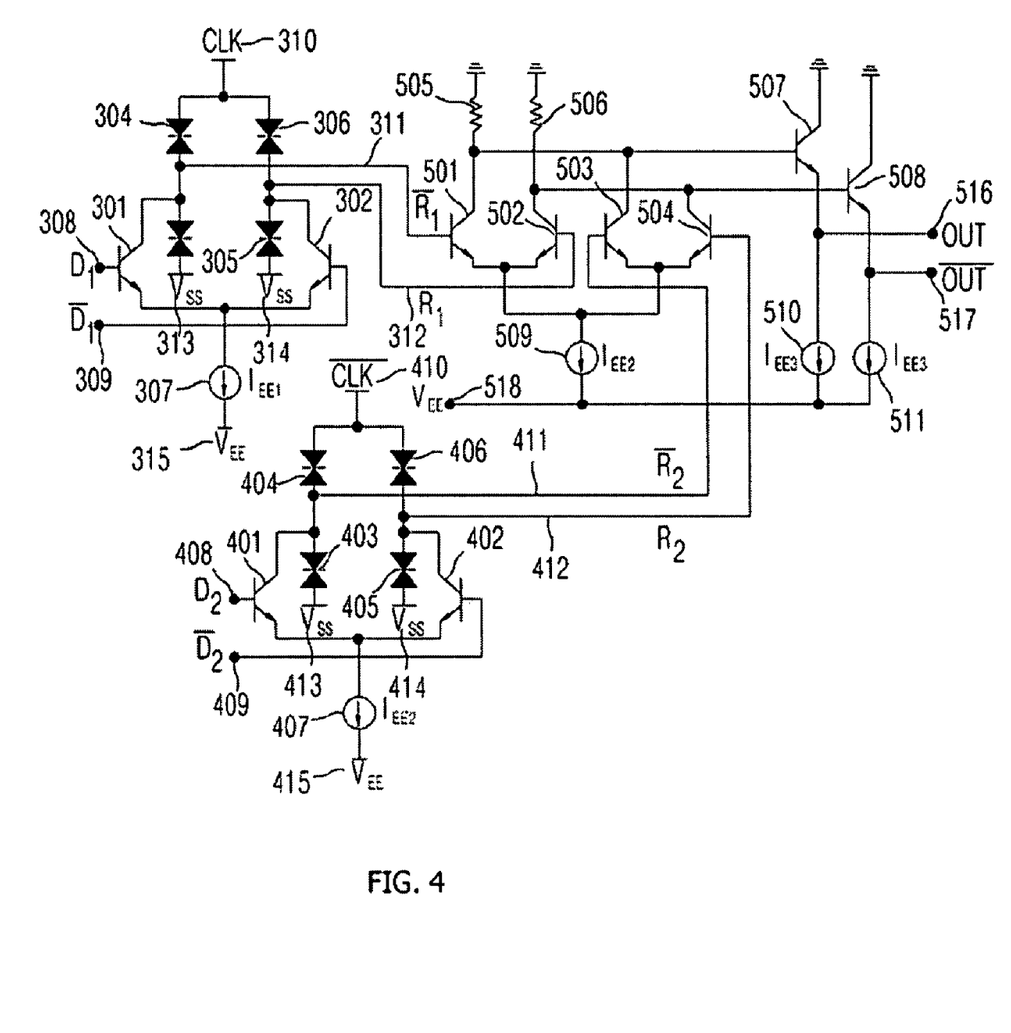
FIG. 4 is a circuit diagram showing the overall construction of a multiplexer circuit according to an embodiment of the present invention.
Figure 5:
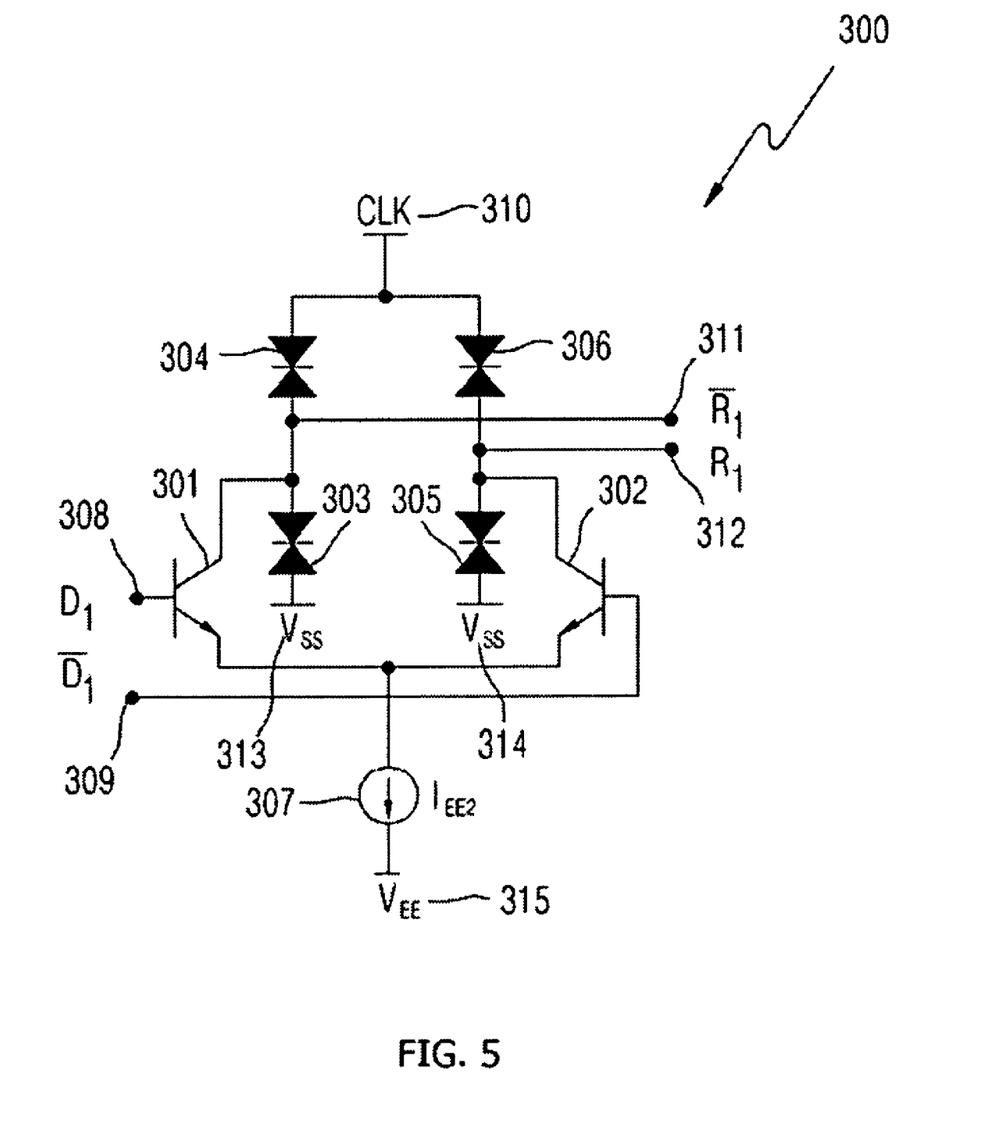
FIG. 5 is a circuit diagram showing a first differential output unit according to an embodiment of the present invention.
Figure 6:
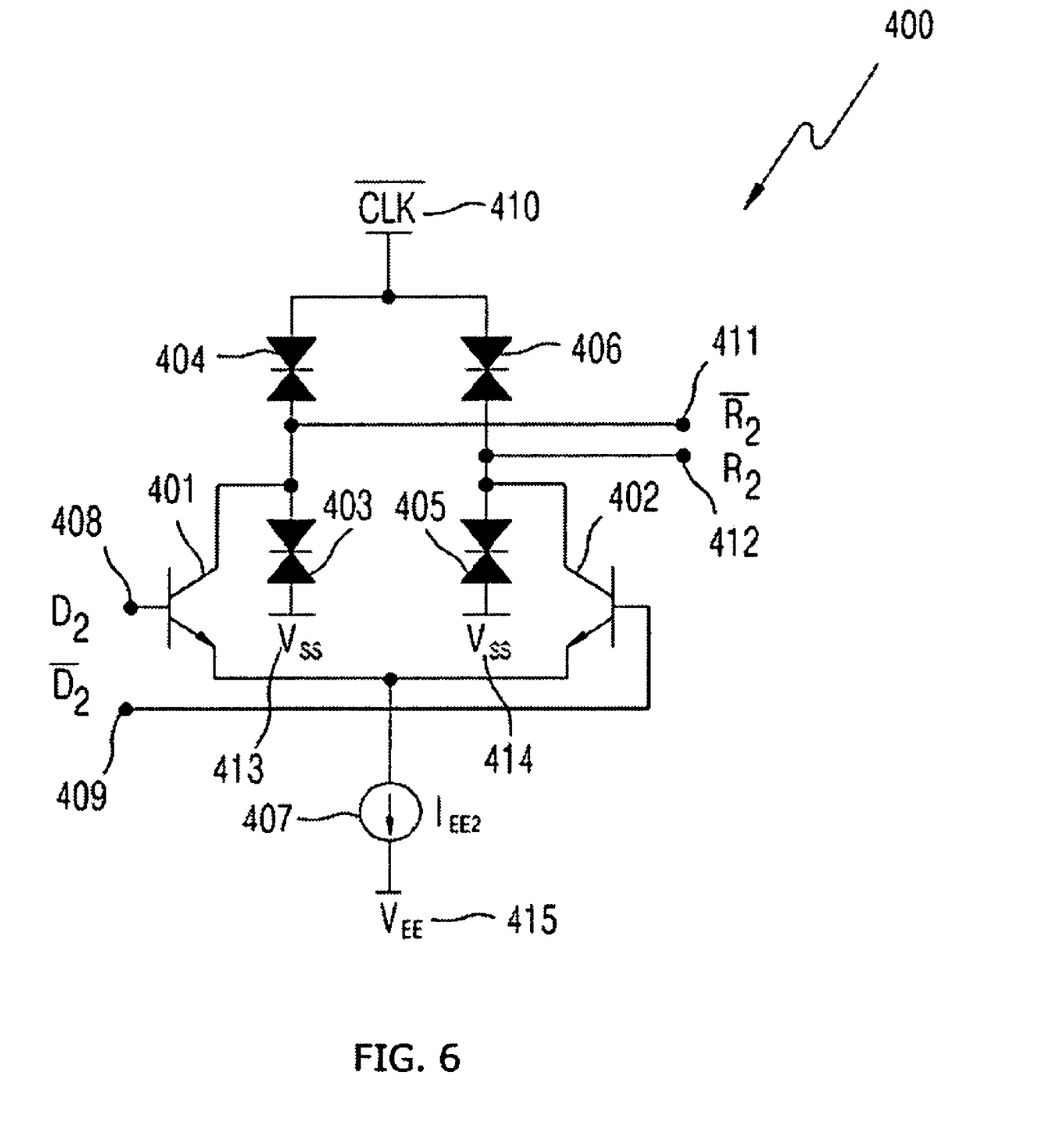
FIG. 6 is a circuit diagram showing a second differential output unit according to an embodiment of the present invention.
Figure 7:
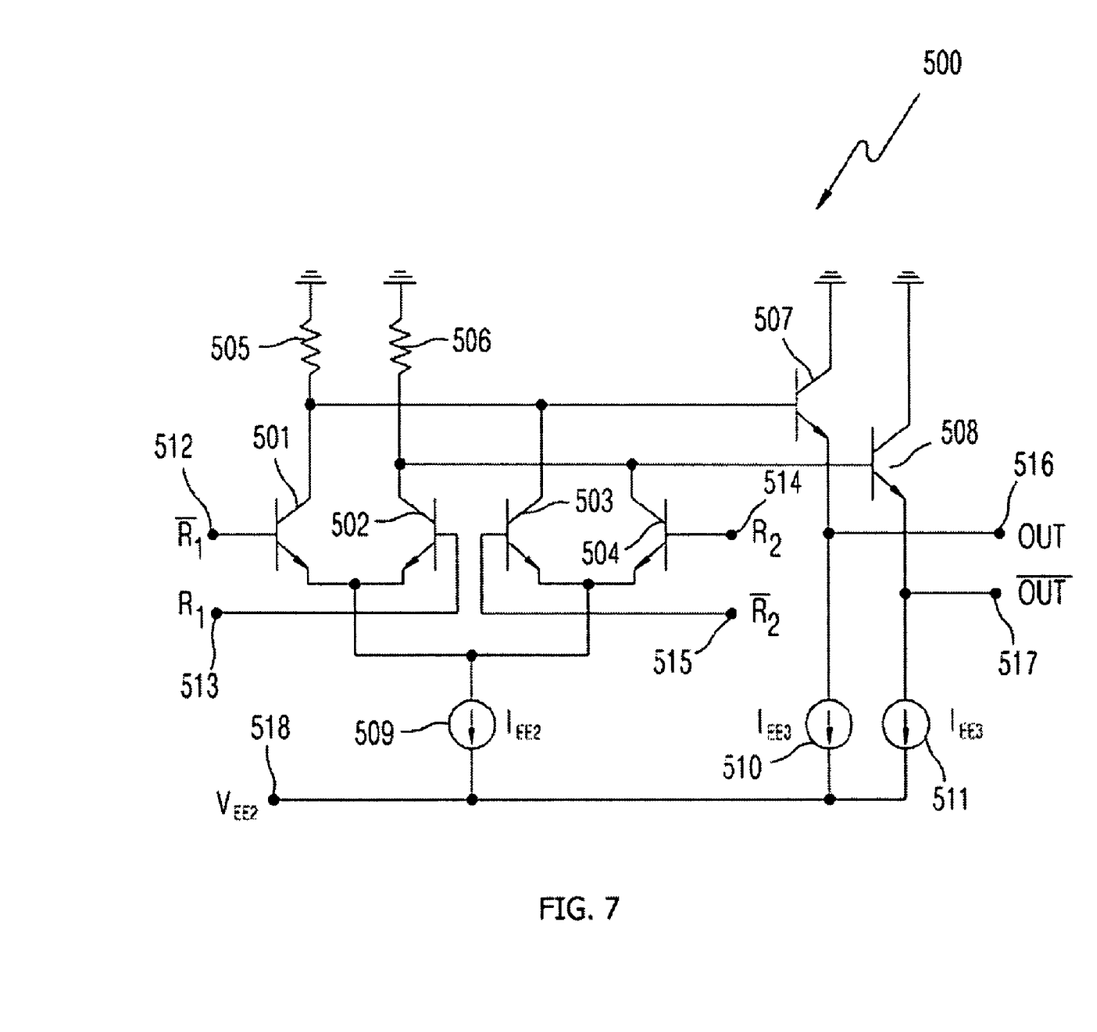
FIG. 7 is a circuit diagram showing a selection unit according to an embodiment of the present invention.
Figure 8:
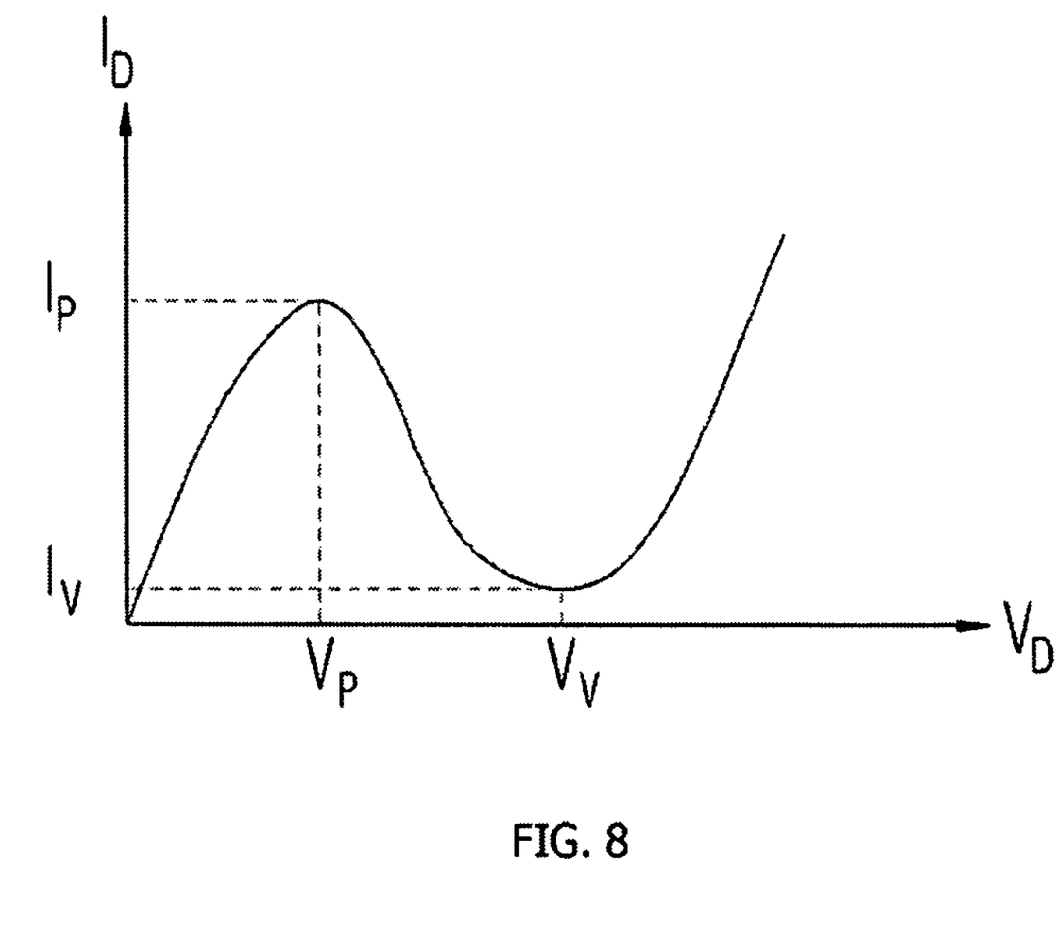
FIG. 8 is a graph showing the DC current-voltage characteristics of a negative differential resistance diode according to an embodiment of the present invention.
Figure 9:
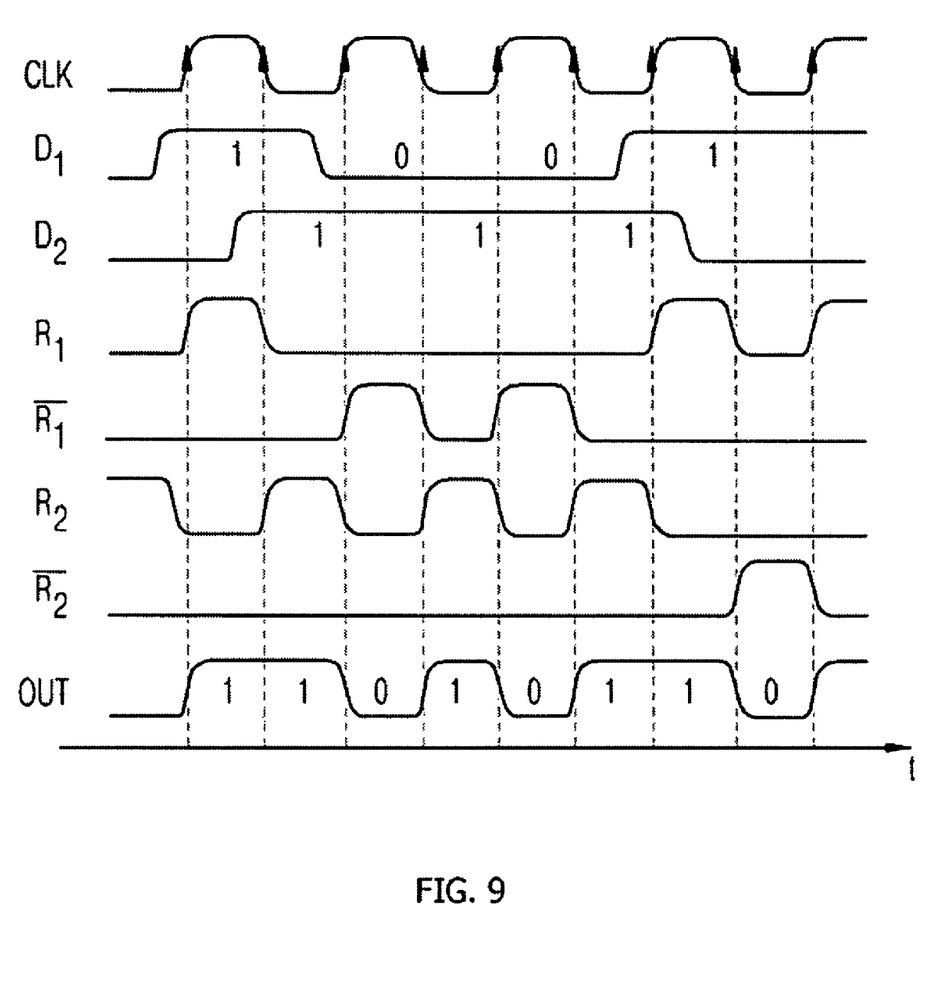
FIG. 9 is a timing diagram of the multiplexer circuit according to an embodiment of the present invention.
Figure 10:
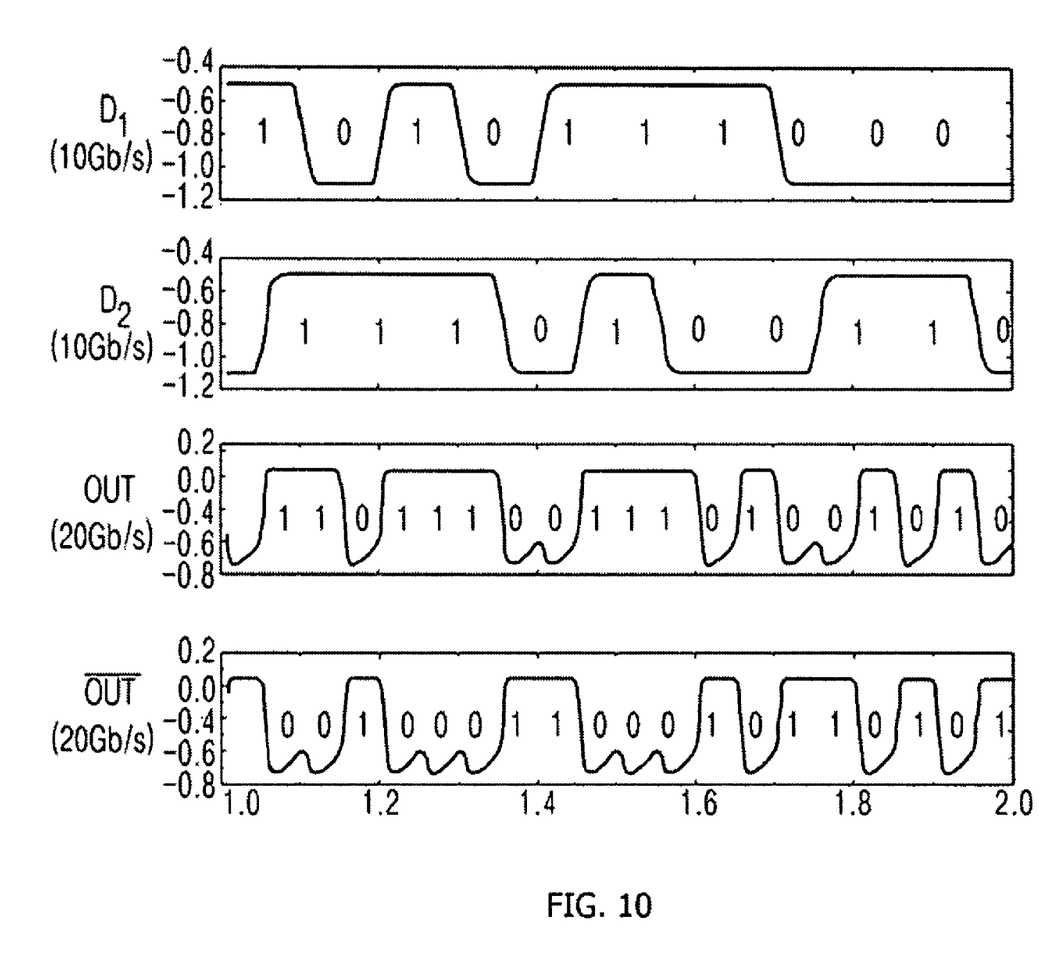
FIG. 10 is a graph showing the results of the simulation of the multiplexer circuit of the embodiment at 20 Gb/s.
Figure 11:
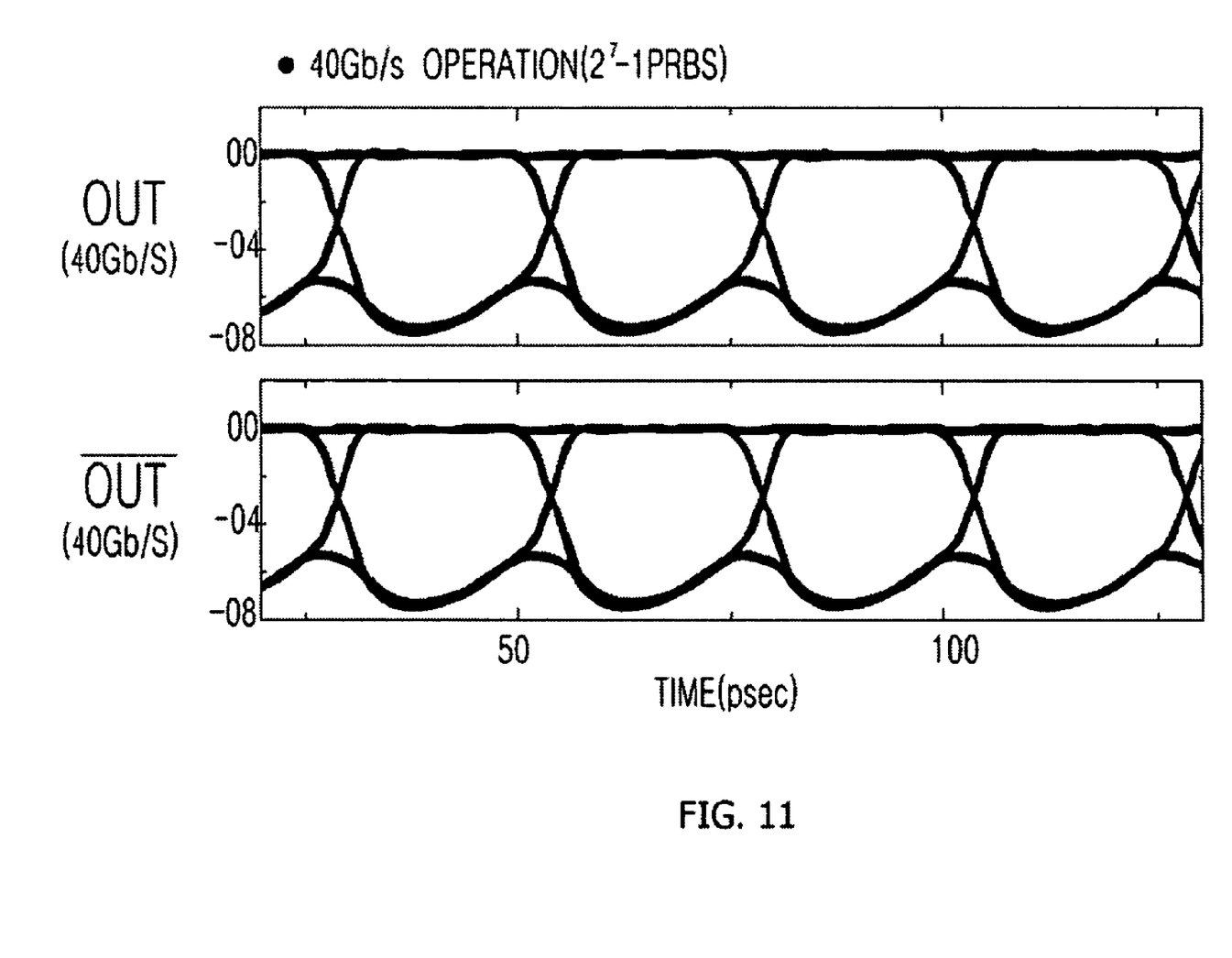
FIG. 11 is an eye diagram showing the results of the simulation of the multiplexer circuit of the embodiment at 40 Gb/s.
Figure 12:
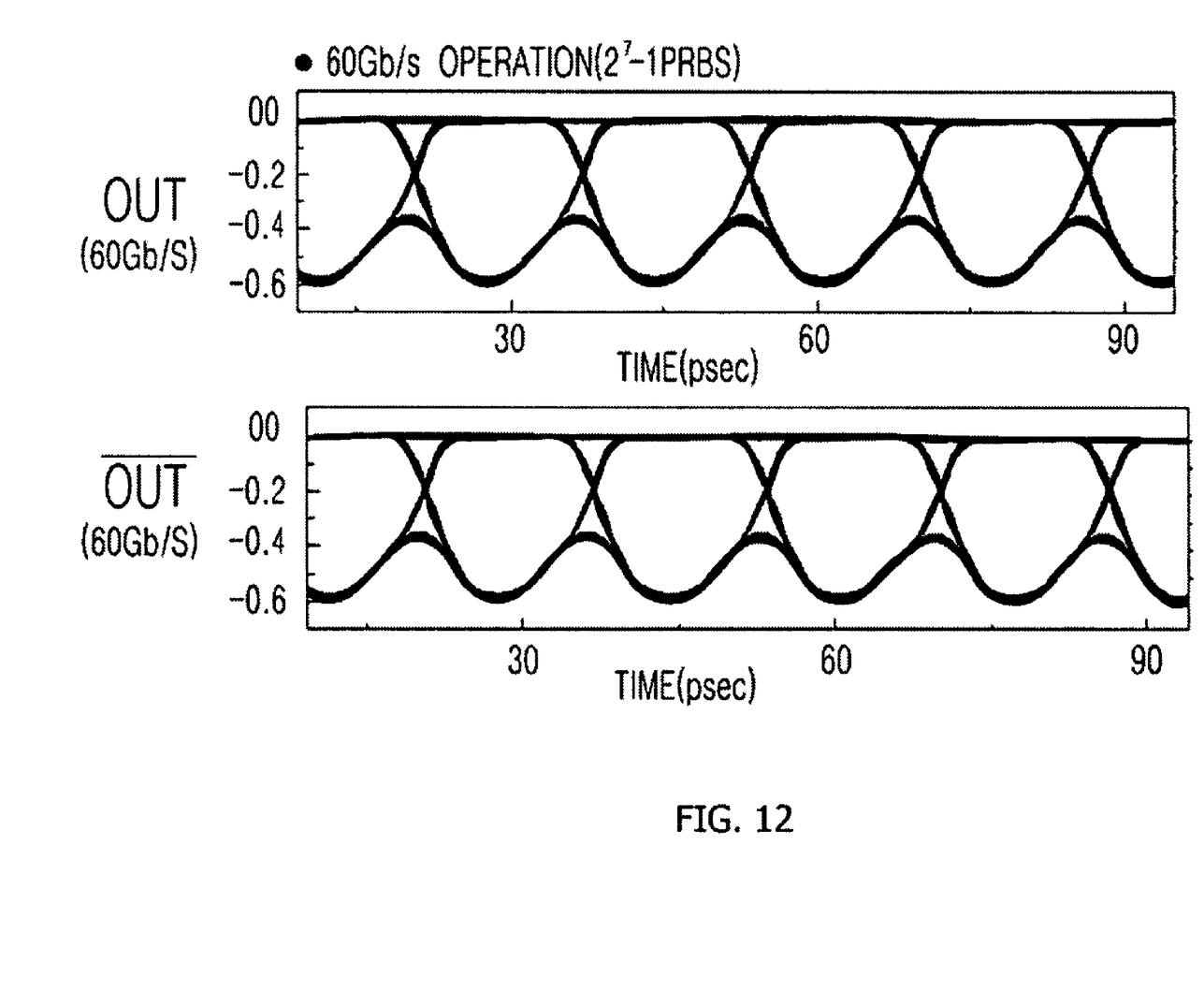
FIG. 12 is an eye diagram showing the results of the simulation of the multiplexer circuit of the embodiment at 60 Gb/s.

FIG. 4 is a circuit diagram showing the overall construction of a multiplexer circuit according to an embodiment of the present invention. FIG. 5 is a circuit diagram showing a first differential output unit according to an embodiment of the present invention. FIG. 6 is a circuit diagram showing a second differential output unit according to the embodiment of the present invention. FIG. 7 is a circuit diagram showing a selection unit according to the embodiment of the present invention. FIG. 8 is a graph showing the DC current-voltage characteristics of a negative differential resistance diode according to the embodiment of the present invention. FIG. 9 is a timing diagram of the multiplexer circuit according to the embodiment of the present invention. FIG. 10 is a graph showing the results of the simulation of the multiplexer circuit of the embodiment at 20 Gb/s. FIG. 11 is an eye diagram showing the results of the simulation of the multiplexer circuit of the embodiment at 40 Gb/s. FIG. 12 is an eye diagram showing the results of the simulation of the multiplexer circuit of the embodiment at 60 Gb/s.

As shown in FIG. 4, the multiplexer circuit according to the present invention includes a first differential output unit 300, a second differential output unit 400, and a selection unit 500.

The first differential output unit 300, as shown in FIG. 5, performs a function of receiving NRZ-mode data inputs $D_1$ and $D_2$ and a CLK signal 310, and generating differential RZ-mode outputs $R_1$ and $\overline{R_1}$.

The first differential output unit 300, which is used to perform the above-described function, includes a first transistor 301, a second transistor 302, a first driver negative differential resistance diode 303, a first load negative differential resistance diode 304, a second driver negative differential resistance diode 305, a second load negative differential resistance diode 306, a first current source 307, a $D_1$ input terminal 308, a $\overline{D_1}$ input terminal 309, a CLK input terminal 310, an $\overline{R_1}$ output terminal 311, an $R_1$ output terminal 312, a first bias terminal 313, a second bias terminal 314, and a first voltage source 315.

First, the first load negative differential resistance diode is connected in series to the first driver negative differential resistance diode 303. The first load negative differential resistance diode 304 is connected to the CLK input terminal 310. The first driver negative differential resistance diode 303 is connected to the first bias terminal 313. The second load negative differential resistance diode 306 is connected in series to the second driver negative differential resistance diode 305. The second load negative differential resistance diode 306 is connected to the CLK input terminal 310. The second driver negative differential resistance diode 305 is connected to the second bias terminal 314.

Further, the base of the first transistor 301 is connected to the $D_1$ input terminal 308, and receives NRZ-mode non-inverted data $D_1$. The collector of the first transistor 301 is connected between the first driver negative differential resistance diode 303 and the first load negative differential resistance diode 304, thus being connected to an $\overline{R_1}$ output terminal 311.

The base of the second transistor 302 is connected to the $\overline{D_1}$ input terminal 309, and receives NRZ-mode inverted data $\overline{D_1}$. The collector of the second transistor 302 is connected between the second driver negative differential resistance diode 305 and the second load negative differential resistance diode 306, thus being connected to an $R_1$ output terminal 312. The emitters of the above-described described first and second transistors 301 and 302 are connected to each other, thus being connected to the first current source 307. The first current source 307 is connected to the first voltage source 315.

Further, the second differential output unit 400, as shown in FIG. 6, performs a function of receiving NRZ-mode data inputs $D_2$ and $\overline{D_2}$ and an inverted clock signal $\overline{CLK}$ 410, and generating RZ-mode outputs $R_2$ and $\overline{R_2}$.

The second differential output unit 400, which is used to perform the above-described function, includes a third transistor 401, a fourth transistor 402, a third driver negative differential resistance diode 403, a third load negative differential resistance diode 404, a fourth driver negative differential resistance diode 405, a fourth load negative differential resistance diode 406, a second current source 407, a $D_2$ input terminal 408, a $\overline{D_2}$ input terminal 409, a $\overline{CLK}$ input terminal 410, an $\overline{R_2}$ output terminal 411, an $R_2$ output terminal 412, a third bias terminal 413, a fourth bias terminal 414, and a second voltage source 415.

First, the third load negative differential resistance diode 404 is connected in series to the third driver negative differential resistance diode 403. The third load negative differential resistance diode 404 is connected to the $\overline{CLK}$ input terminal 410. The third driver negative differential resistance diode 403 is connected to the third bias terminal 413. The fourth load negative differential resistance diode 406 is connected in series to the fourth driver negative differential resistance diode 405. The fourth load negative differential resistance diode 406 is connected to the $\overline{CLK}$ input terminal 410. The fourth driver negative differential resistance diode 405 is connected to the fourth bias terminal 414.

Further, the base of the third transistor 401 is connected to the $D_2$ input terminal 408, and receives NRZ-mode non-inverted data $D_2$. The collector of the third transistor 401 is connected between the third driver negative differential resistance diode 403 and the third load negative differential resistance diode 404, thus being connected to the $\overline{R_2}$ output terminal 411.

The base of the fourth transistor 402 is connected to the $\overline{D_2}$ input terminal 409, and receives the NRZ-mode inverted data $\overline{D_2}$. The collector of the fourth transistor 402 is connected between the fourth driver negative differential resistance diode 405 and the fourth load negative differential resistance diode 406, thus being connected to the $R_2$ output terminal 412. The emitters of the above-described third and fourth transistors 401 and 402 are connected to each other, thus being connected to the second current source 407. The second current source 407 is connected to the second voltage source 415.

The first differential output unit 300 and the second differential output unit 400 according to the present embodiment are CML-type Monostable-Bistable Transition Logic Element (MOBILE) circuits.

Further, the selection unit 500, as shown in FIG. 7, performs a function of receiving RZ-mode signals $R_1$ and $\overline{R_1}$, generated at the first differential output unit 300, and RZ-mode signals $R_2$ and $\overline{R_2}$, generated at the second differential output unit 400, and generating NRZ mode outputs, the operating speed of which is twice as fast as that of RZ mode outputs in each half cycle of the CLK signal.

The selection unit 500, which is used to perform the above-described functions, includes a fifth transistor 501, a sixth transistor 502, a seventh transistor 503, an eighth transistor 504, a first load resistor 505, a second load resistor 506, a ninth transistor 507, a tenth transistor 508, a third current source 509, a fourth current source 510, a fifth current source 511, an $\overline{R_1}$ input terminal 512, an $R_1$ input terminal 513, an $R_2$ input terminal 514, an $\overline{R_2}$ input terminal 515, an OUT output terminal 516, an $\overline{OUT}$ output terminal 517, and a third voltage source 518.

The base of the fifth transistor 501 receives an RZ-mode $\overline{R_1}$ output from the $\overline{R_1}$ output terminal 311 of the first differential output unit 300 through the $\overline{R_1}$ input terminal 512. The collector of the fifth transistor 501 is connected to the first load resistor 505. The first load resistor 505 is connected to ground.

The base of the sixth transistor 502 receives an RZ-mode $R_1$, output from the $R_1$ output terminal 312 of the first differential output unit 300, through the $R_1$ input terminal 513. The collector of the sixth transistor 502 is connected to the second load resistor 506. The second load resistor 506 is connected to ground.

The base of the seventh transistor 503 receives an RZ-mode $\overline{R_2}$ output from the $\overline{R_2}$ output terminal 411 of the second differential output unit 400 through the $\overline{R_2}$ input terminal 515. The collector of the seventh transistor 503 is connected to the junction between the collector of the fifth transistor 501 and the first load resistor.

The base of the eighth transistor 504 receives an RZ-mode $R_2$, output from the $R_2$ output terminal 412 of the second differential output unit 400 through the $R_2$ input terminal 514. The collector of the eighth transistor 504 is connected to the junction between the collector of the sixth transistor 502 and the second load resistor 506.

The emitters of the above-described fifth transistor 501, sixth transistor 502, seventh transistor 503, and eighth transistor 504 are connected to each other, thus being connected to the third current source 509. The third current source 509 is connected to the third voltage source 518.

The base of the ninth transistor 507 is connected to the collectors of the fifth and seventh transistors 501 and 503. The collector of the ninth transistor 507 is connected to ground, and the emitter of the ninth transistor 507 is connected to the fourth current source 510. The fourth current source 510 is connected to the third voltage source 518. The junction between the emitter of the ninth transistor 507 and the fourth current source 510 is connected to the NRZ-mode OUT output terminal 516.

The base of the tenth transistor 508 is connected to the collectors of the sixth and eighth transistors 502 and 504. The collector of the tenth transistor 508 is connected to ground, and the emitter of the tenth transistor 508 is connected to the fifth current source 511. The fifth current source 511 is connected to the third voltage source 518. The junction between the emitter of the tenth transistor 508 and the fifth current source 511 is connected to the NRZ-mode $\overline{OUT}$ output terminal 517.

The ninth transistor 507 and the tenth transistor 508 according to the embodiment of the present invention are emitter followers.

The DC current-voltage characteristics of the negative differential resistance diode used in the embodiment of the present invention are shown in FIG. 8. When a circuit is implemented using diodes having negative differential resistance characteristics, there is an advantage in that the number of devices can be reduced, and a digital circuit, which realizes high operating speed as well as low power operation, can be implemented because the number of devices is decreased.

The operation of the multiplexer circuit according to the present invention is described below.

The construction of a circuit in which RZ-mode differential output signals are generated using two NRZ-mode input data signals $D_1$ and $D_2$ in response to a CLK signal is shown in FIGS. 5 and 6.

According to the operating principal of a MOBILE circuit, when a CLK is at a high level, the RZ-mode signals of the $R_1$ output terminal 312 and the $\overline{R_1}$ output terminal 311 are generated based on the input data signal $D_1$. In this case, the signals of the $R_2$ output terminal 412 and the $\overline{R_2}$ output terminal 411 are at a low level. In contrast, when a CLK is at a low level, the RZ-mode signals of the $R_2$ output terminal 412 and the $\overline{R_2}$ output terminal 411 are generated based on the input data signal $D_2$, and the signals of the $R_1$ output terminal 312 and the $\overline{R_1}$ output terminal 311 are at a low level. Therefore, the CML-type MOBILE circuit generates differential outputs in each half cycle of the CLK signal.

The selection unit 500, as shown in FIG. 7, receives the RZ-mode signals $R_1$ and $\overline{R_1}$, generated at the CML-type first differential output unit 300, and RZ-mode signals $R_2$ and $\overline{R_2}$, generated at the second differential output unit 400, and generates RZ-to-NRZ-mode outputs in each half cycle of the CLK signal.

RZ-mode signals are generated at the first differential output unit 300 of FIG. 5 and the second differential output unit 400 of FIG. 6. That is, only one signal is at a high level, and the other signals are at a low level in each half cycle of the CLK signal. Therefore, only one of the input terminal transistors 501, 502, 503, and 504 of the selection unit 500 is turned on, and the current of the third current source 509 of the selection unit 500 flows through the turned-on transistor, thereby generating outputs. The operation is summarized in the following Table 1.

TABLE 1

| NRZ DATA | | | NRZ Signals | | | | NRZ outputs | |
|---|---|---|---|---|---|---|---|---|
| $D_1$ | $D_2$ | CLK | $R_1$ | $\overline{R_1}$ | $R_2$ | $\overline{R_2}$ | OUT | $\overline{OUT}$ |
| 0 | 0 | 1 | 0 | 1 | 0 | 0 | 0 | 1 |
| 0 | 1 | 1 | 0 | 1 | 0 | 0 | 0 | 1 |
| 1 | 0 | 1 | 1 | 0 | 0 | 0 | 1 | 0 |
| 1 | 1 | 1 | 1 | 0 | 0 | 0 | 1 | 0 |
| 0 | 0 | 0 | 0 | 0 | 0 | 1 | 0 | 1 |
| 0 | 1 | 0 | 0 | 0 | 1 | 0 | 1 | 0 |
| 1 | 0 | 0 | 0 | 0 | 0 | 1 | 0 | 1 |
| 1 | 1 | 0 | 0 | 0 | 1 | 0 | 1 | 0 |

As shown in Table 1, when an input data signal $D_1$ is at a high level and a clock signal (CLK) is at a high level, a signal $R_1$ is at a high level regardless of the state of an input data signal $D_2$, and the other RZ signals $\overline{R_1}$, $R_2$, and $\overline{R_2}$ are at a low level. Therefore, only the sixth transistor 502 of the selection unit 500 is turned on, the current of the third current source 309 flows through the sixth transistor 502, the state of the OUT output terminal 516 is at a high level, and the state of the inverted signal ($\overline{OUT}$) output terminal 517 is at a low level. In contrast, when the CLK is at a low level, an output having the value of $D_2$ is generated, regardless of the state of the input data signal $D_1$.

Further, as shown in FIG. 9, in the timing diagram of the multiplexer circuit according to the embodiment of the present invention, when '1001' is applied as the input data signal $D_1$ and 1110 is applied as the input data signal $D_2$, the output '11010110', into which the two input data signals have been multiplexed, is generated. In this case, the operating speed of the output is twice as fast as that of the input data.

Further, the results of the simulation of the multiplexer circuit according to the embodiment of the present invention are shown in FIG. 10. That is, it was observed that a multiplexed output signal at 20 Gb/s was generated when input data signals $D_1$ and $D_2$ at 10 Gb/s were applied to inputs.

The results of an eye diagram simulation of the multiplexer circuit according to the embodiment of the present invention are shown in FIGS. 11 and 12. That is, as shown in FIG. 11, for input data signals at 20 Gb/s, an output signal was output at 40 Gb/s. As shown in FIG. 12, for input signals at 30 Gb/s, an output signal was output at 60 Gb/s. That is, as shown in FIGS. 11 and 12, it was observed through the simulation that an output signal, which had an operating speed twice as fast as that of the input signals, was generated by the circuit proposed in the present invention.

Further, in order to test the performance of the multiplexer circuit according to the embodiment of the present invention, the comparison of the multiplexer circuit of the embodiment of the present invention with a conventional master-slave 2:1 multiplexer circuit was performed using the same device models. The results of the comparison are shown in Table 2.

TABLE 2

| | multiplexer circuit according to the present invention | conventional master-slave 2:1 multiplexer circuit | comparison |
|---|---|---|---|
| Number of Devices | 21 | 66 | 1/3 |
| Voltage source ($V_{EE}$) | −2.4 V | −3.3 V | 3/4 |
| Power consumption | 28 mW | 190 mW | 1/6 |

As shown in Table 2, in order to implement the multiplexer circuit according to the present invention, twenty one devices, including resistors and transistors, are necessary. In the case of the prior art, sixty six elements are necessary. That is, the number of devices of the multiplexer circuit based on negative differential resistance diodes according to the present invention is reduced to ⅓ of the number of devices of the prior art. Further, the power consumption of the multiplexer circuit according to the present invention is 28 mW thanks to the use of a low voltage source, thereby exhibiting excellent power consumption characteristics, in which the power consumption of the total circuit is ⅙ of the power consumption of the prior art.

Although the multiplexer circuit according to the present invention has been described using an HBT, the operating speed of which is highest among BJTs, the present invention is not limited thereto, but can be applied to all 3-terminal transistor-based technologies, including a BJT and a Field Effect Transistor (FET).

According to the present invention, there is an advantage in that the construction of a circuit is simplified using negative differential resistance diodes.

Furthermore, according to the present invention, there is an advantage in that low-power operating characteristics, which reduce the power consumption of a circuit, can be achieved by generating an NRZ-mode multiplexed output using an RZ-mode input.

Moreover, according to the present invention, there is an advantage in that operating speed is improved using CML-type transistors.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A multiplexer circuit, comprising:
    a first differential output unit for receiving NRZ input signals ($D_1$ and $\overline{D_1}$) and a clock signal (CLK), and generating differential RZ-mode outputs ($R_1$ and $\overline{R_1}$);
    a second differential output unit for receiving NRZ input signals ($D_2$ and $\overline{D_2}$) and an inverted clock signal ($\overline{CLK}$), and generating differential RZ-mode outputs ($R_2$ and $\overline{R_2}$); and
    a selection unit for receiving the RZ-mode output signals ($R_1$, $\overline{R_1}$, $R_2$, and $\overline{R_2}$) generated at the first differential output unit and the second differential output unit, and generating NRZ mode outputs in each half cycle of the clock signal (CLK).

2. The multiplexer circuit as set forth in claim 1, wherein the first differential output unit is configured such that:
    a base of a first transistor is connected to a $D_1$ input terminal, and a base of a second transistor is connected to a $\overline{D_1}$ input terminal;
    a first load negative differential resistance diode, connected to a CLK input terminal, is connected in series to a first driver negative differential resistance diode connected to a first bias terminal, and a collector of the first transistor is connected between the first load negative differential resistance diode and the first driver negative differential resistance diode;
    a second load negative differential resistance diode, connected to the CLK input terminal, is connected in series to a second driver negative differential resistance diode connected to a second bias terminal, and a collector of the second transistor is connected between the second load negative differential resistance diode and the second driver negative differential resistance diode;

an $\overline{R_1}$ output terminal is connected between the first load negative differential resistance diode and the first driver negative differential resistance diode, and an $R_1$ output terminal is connected between the second load negative differential resistance diode and the second driver negative differential resistance diode; and an emitter of the first transistor is connected to an emitter of the second transistor, and the emitters are connected in common to a first voltage source through a first current source.

3. The multiplexer circuit as set forth in claim 1, wherein the second differential output unit is configured such that:

a base of a third transistor is connected to a $D_2$ input terminal, and a base of a fourth transistor is connected to a $\overline{D_2}$ input terminal;

a third load negative differential resistance diode, connected to a $\overline{CLK}$ input terminal, is connected in series to a third driver negative differential resistance diode connected to a third bias terminal, and a collector of the third transistor is connected between the third load negative differential resistance diode and the third driver negative differential resistance diode;

a fourth load negative differential resistance diode, connected to the $\overline{CLK}$ input terminal, is connected in series to a fourth driver negative differential resistance diode connected to a fourth bias terminal, and a collector of the fourth transistor is connected between the fourth load negative differential resistance diode and the fourth driver negative differential resistance diode;

an $\overline{R_2}$ output terminal is connected between the third load negative differential resistance diode and the third driver negative differential resistance diode, and an $R_2$ output terminal is connected between the fourth load negative differential resistance diode and the fourth driver negative differential resistance diode; and an emitter of the third transistor is connected to an emitter of the fourth transistor, and the emitters are connected in common to a second voltage source through a second current source.

4. The multiplexer circuit as set forth in claim 1, wherein the first differential output unit is configured such that, when the clock signal at a high level is applied to a CLK input terminal, RZ-mode signals of an $R_1$ output terminal and an $\overline{R_1}$ output terminal are generated based on the input data signal $D_1$, and signals of an $R_2$ output terminal and an $\overline{R_2}$ output terminal are at a low level.

5. The multiplexer circuit as set forth in claim 1, wherein the second differential output unit is configured such that, when the clock signal at a high level is applied to a $\overline{CLK}$ input terminal, RZ-mode signals of an $R_2$ output terminal and an $\overline{R_2}$ output terminal are generated based on the input data signal $D_2$, and signals of an $R_1$ output terminal and an $\overline{R_1}$ output terminal are at a low level.

6. The multiplexer circuit as set forth in claim 1, wherein the selection unit is configured such that:

a base of a fifth transistor is connected to an $\overline{R_1}$ input terminal for receiving an $\overline{R_1}$ output signal from the first differential output unit, a base of a sixth transistor is connected to an $R_1$ input terminal for receiving an $R_1$ output signal from the first differential output unit, a base of a seventh transistor is connected to an $\overline{R_2}$ input terminal for receiving an $\overline{R_2}$ output signal from the second differential output unit, and a base of an eighth transistor is connected to an $R_2$ input terminal for receiving an $R_2$ output signal from the second differential output unit;

a collector of the fifth transistor and a collector of the seventh transistor are connected to ground through a first load resistor, and a collector of the sixth transistor and a collector of the eighth transistor are connected to ground through a second load resistor;

emitters of the fifth, sixth, seventh, and eighth transistors are connected to each other, thus being connected to a third voltage source through a third current source;

a base of a ninth transistor is connected to the collectors of the fifth and seventh transistors, thus being connected to ground through the first load resistor, a base of a tenth transistor is connected to the collectors of the sixth and eighth transistors, thus being connected to ground through the second load resistor, an emitter of the ninth transistor is connected to the third voltage source through a fourth current source, and an emitter of the tenth transistor is connected to the third voltage source through a fifth current source; and an OUT output terminal is connected between the emitter of the ninth transistor and the fourth current source, and an $\overline{OUT}$ output terminal is connected between the emitter of the tenth transistor and the fifth current source.

7. The multiplexer circuit as set forth in claim 1, wherein the selection unit is configured such that, when the RZ-mode output signals ($R_1$, $\overline{R_1}$, $R_2$, and $\overline{R_2}$), generated at the first differential output unit and the second differential output unit, are received, at least one of the fifth to eighth transistors is turned on, and a third current source flows through the turned-on transistor, thus generating an output.

8. The multiplexer circuit as set forth in claim 1, wherein the first differential output unit and the second differential output unit are Current Mode Logic (CML)-type Monostable-Bistable Transition Logic Elements (MOBILEs).

9. The multiplexer circuit as set forth in claim 6, wherein the ninth transistor and the tenth transistor are emitter followers.

* * * * *